United States Patent
Lane et al.

(10) Patent No.: US 11,249,393 B2
(45) Date of Patent: Feb. 15, 2022

(54) NANOIMPRINT LITHOGRAPHY PROCESSES FOR SWITCHING MECHANICAL PROPERTIES OF IMPRINT MATERIALS

(71) Applicant: Facebook Technologies, LLC, Menlo Park, CA (US)

(72) Inventors: Austin Lane, Redmond, WA (US); Matthew E. Colburn, Woodinville, WA (US); Giuseppe Calafiore, Redmond, WA (US); Nihar Ranjan Mohanty, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 360 days.

(21) Appl. No.: 16/252,563

(22) Filed: Jan. 18, 2019

(65) Prior Publication Data
US 2019/0346759 A1 Nov. 14, 2019

Related U.S. Application Data

(60) Provisional application No. 62/669,212, filed on May 9, 2018.

(51) Int. Cl.
*G03F 7/00* (2006.01)
*G03F 7/20* (2006.01)
(Continued)

(52) U.S. Cl.
CPC ............ *G03F 7/0002* (2013.01); *G03F 7/027* (2013.01); *G03F 7/2002* (2013.01);
(Continued)

(58) Field of Classification Search
CPC ......... G03F 7/0002; G03F 7/16; G03F 7/2002
See application file for complete search history.

(56) References Cited

U.S. PATENT DOCUMENTS

| | | | |
|---|---|---|---|
| 2004/0137734 A1* | 7/2004 | Chou | B29C 37/0067 438/689 |
| 2006/0255505 A1 | 11/2006 | Sandhu et al. | |

(Continued)

OTHER PUBLICATIONS

Yadav, "Nanoimprinting Techniques for Polymeric Electronic Devices", Dissertation, Technical University of Munich (Year: 2014).*
(Continued)

*Primary Examiner* — James Sanders
(74) *Attorney, Agent, or Firm* — Fenwick & West LLP

(57) ABSTRACT

A method is described for modifying the mechanical properties of NIL materials. The method includes applying an imprint mask to a nano-imprint lithography (NIL) material layer to create an imprinted NIL material layer, with the NIL material layer comprised of a NIL material. The method further includes detaching the imprinted NIL material layer from the imprint mask, with the modulus level of the NIL material below a flexibility threshold to cause a shape of the imprinted NIL material layer to remain unchanged after detachment. The modulus level of the NIL material of the imprinted NIL material layer is increased beyond a strength threshold to create a first imprint layer, with the imprint layer having a structure that remains unaffected by a subsequent process to form a second imprint layer matching a master mold pattern.

1 Claim, 7 Drawing Sheets

(51) Int. Cl.
    *G03F 7/027*     (2006.01)
    *G03F 7/004*     (2006.01)
    *G03F 7/16*     (2006.01)
    *G03F 7/36*     (2006.01)

(52) U.S. Cl.
    CPC .............. *G03F 7/0043* (2013.01); *G03F 7/16* (2013.01); *G03F 7/36* (2013.01); *G03F 7/70491* (2013.01)

(56) References Cited

U.S. PATENT DOCUMENTS

| | | | |
|---|---|---|---|
| 2007/0252293 A1* | 11/2007 | Sato | B29C 39/20 |
| | | | 264/1.31 |
| 2008/0204684 A1 | 8/2008 | Cho et al. | |
| 2008/0274323 A1 | 11/2008 | Raby et al. | |
| 2009/0224416 A1 | 9/2009 | Laakkonen et al. | |
| 2009/0256287 A1 | 10/2009 | Fu et al. | |
| 2009/0264317 A1 | 10/2009 | Ofir et al. | |
| 2011/0084424 A1 | 4/2011 | Kaida et al. | |
| 2011/0183027 A1 | 7/2011 | Miller et al. | |
| 2012/0141738 A1 | 6/2012 | Miyake et al. | |
| 2012/0183690 A1* | 7/2012 | Titulaer | H01L 31/02366 |
| | | | 427/256 |
| 2013/0200553 A1 | 8/2013 | Yamada et al. | |
| 2017/0259461 A1 | 9/2017 | Rolland et al. | |
| 2018/0088468 A1 | 3/2018 | de Schiffart et al. | |
| 2019/0031939 A1 | 1/2019 | Villalpando-Paez et al. | |
| 2019/0227429 A1 | 7/2019 | Yang et al. | |
| 2019/0346759 A1 | 11/2019 | Lane et al. | |
| 2019/0346760 A1 | 11/2019 | Lane et al. | |

OTHER PUBLICATIONS

United States Office Action, U.S. Appl. No. 16/252,565, dated Apr. 1, 2021, seven pages.
United States Office Action, U.S. Appl. No. 16/252,564, dated May 24, 2021, 14 pages.
Lan, H. et al. "UV-Nanoimprint Lithography: Structure, Materials and Fabrication of Flexible Molds." Journal of Nanoscience and Nanotechnology, vol. 13, No. 5, May 2013, pp. 3145-3172.
United States Office Action, U.S. Appl. No. 16/252,564, dated Dec. 24, 2020, 11 pages.
United States Office Action, U.S. Appl. No. 16/252,565, dated Dec. 24, 2020, seven pages.
Non-Final Office Action dated Nov. 16, 2021 for U.S. Appl. No. 16/252,564, filed Jan. 18, 2019, 18 pages.

\* cited by examiner

NANOIMPRINT LITHOGRAPHY PROCESSES FOR SWITCHING MECHANICAL PROPERTIES OF IMPRINT MATERIALS

CROSS REFERENCE TO RELATED APPLICATIONS

This application claims the benefit of U.S. Provisional Application No. 62/669,212, filed May 9, 2018, which is incorporated by reference in its entirety.

FIELD OF ART

The disclosure generally relates to the field of nanoimprint lithography (NIL), and specifically to NIL processes for switching mechanical properties of imprint materials.

BACKGROUND

Nano-imprint lithography (NIL) is a process whereby nanometer scale patterns are imprinted, using mechanical processes, on an imprint material. These patterns may be three dimensional in shape (i.e., vary along three different axes). Such patterned materials may have many applications (e.g., for use to channel fluids, act as waveguides, be used for circuit patterns), and in some cases, are manufactured at a cost that is lower than optical lithography. Commonly, these patterns may be created by imprinting the NIL material with a negative mask, i.e., a mold that has an inverse pattern of the desired pattern. After imprinting the NIL material with the mask, the pattern is formed on the NIL material, and the NIL material may then be cured and passed through additional processing steps.

Ideally, when applying the mask, an NIL material with higher flexibility (i.e., lower Young's modulus) is used, so that the application of the mask does not cause the NIL material to fracture or break, especially when the mask is removed from the NIL material. However, such a flexible material is not ideal during later processing steps. For these later processing steps, an NIL material with a high strength, and low flexibility, is desired instead. These materials may be more resilient during subsequent steps, such as curing.

Therefore, a problem exists in NIL with existing NIL material. The existing NIL material has a fixed modulus. However, during the NIL process, it is desirable to have NIL material with low modulus during the initial imprint process, but with high modulus during later post-processing steps.

SUMMARY

Embodiments relate to modifying the mechanical properties of NIL materials. An imprint mask is applied to a nano-imprint lithography (NIL) material layer to create an imprinted NIL material layer, with the NIL material layer comprised of a NIL material. The imprinted NIL material layer is detached from the imprint mask, with the modulus level of the NIL material below a flexibility threshold to cause a shape of the imprinted NIL material layer to remain unchanged after detachment. The modulus level of the NIL material of the imprinted NIL material layer is increased beyond a strength threshold to create a first imprint layer, with the imprint layer having a structure that remains unaffected by a subsequent process to form a second imprint layer matching a master mold pattern.

BRIEF DESCRIPTION OF THE DRAWINGS

The disclosed embodiments have advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Embodiments here disclose a method and system for solving the problem regarding the desire to have NIL material which can have switchable mechanical properties. A method is described for modifying the mechanical properties of NIL materials. The method includes applying an imprint mask to a nano-imprint lithography (NIL) material layer to create an imprinted NIL material layer, with the NIL material layer comprised of a NIL material. The method further includes detaching the imprinted NIL material layer from the imprint mask, with the modulus level of the NIL material below a flexibility threshold to cause a shape of the imprinted NIL material layer to remain unchanged after detachment. The modulus level of the NIL material of the imprinted NIL material layer is increased beyond a strength threshold to create a first imprint layer, with the imprint layer having a structure that remains unaffected by a subsequent process to form a second imprint layer matching a master mold pattern.

Exemplary Processes for Switching Nil Imprint Material Mechanical Properties

Figure 1:
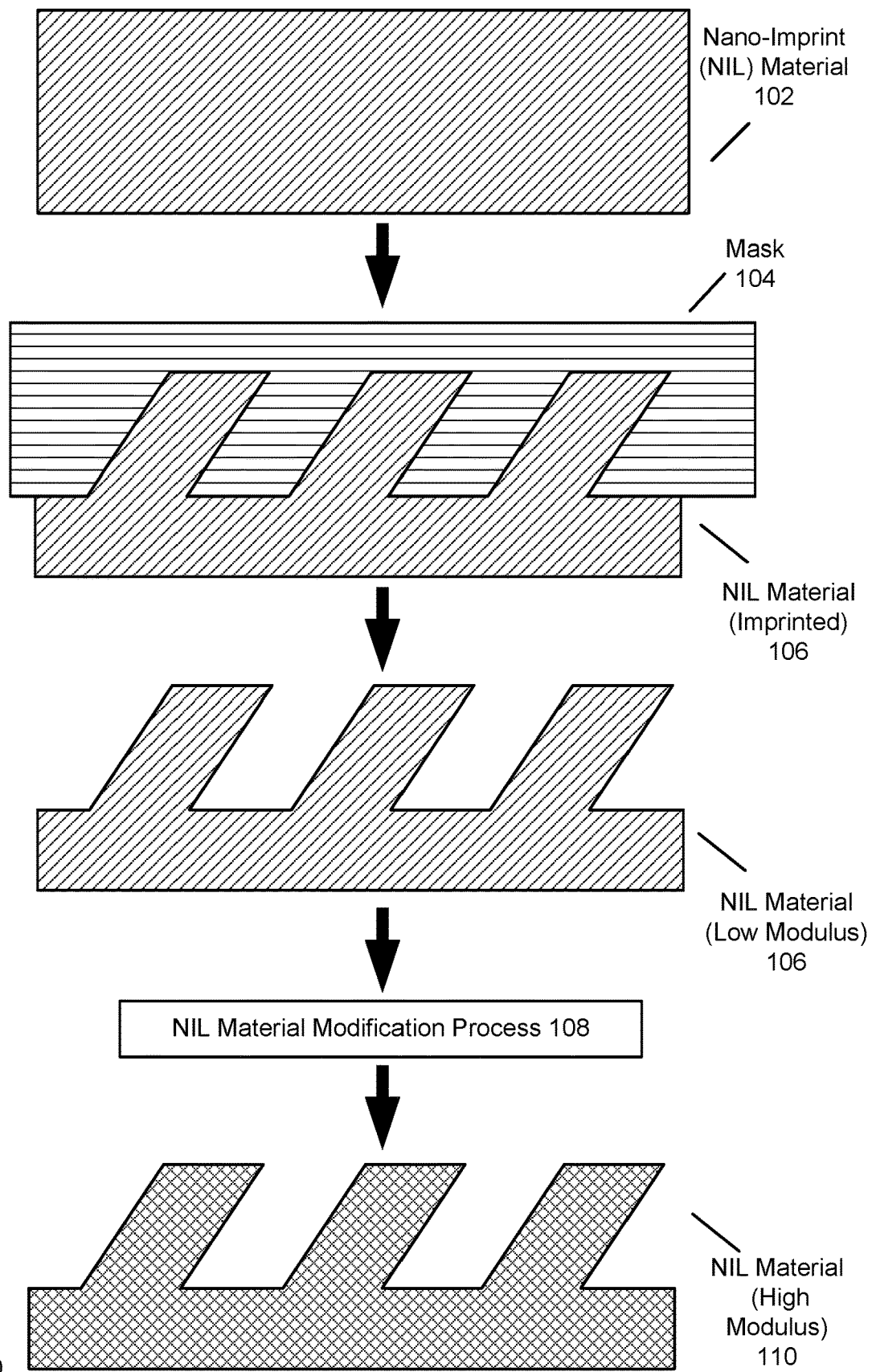
FIG. 1 illustrates an example of a process of switching the mechanical properties of a nano-imprint (NIL) material during the imprint process, according to an example embodiment.

FIG. 1 illustrates an example of a process of switching the mechanical properties of a nano-imprint (NIL) material 102 during the imprint process, according to an example embodiment.

During an initial imprint phase, whereby a mask 104 is imprinted on the NIL material 102, a more flexible NIL material is desired because a stiffer material may break when the NIL material is released from the mask 104. However, during later processing steps, a stiffer NIL material is desired because NIL material that is flexible may suffer from feature collapse during these post processing steps (i.e., the features on the imprinted NIL material may be changed during the post processing phase in an undesired fashion).

Therefore, a process which can change the mechanical properties of the NIL material, in order to change it from a material with low modulus to a material with high modulus after imprinting is desirable. FIG. 1 illustrates a general outline of such a process, including a NIL material modification process 110 operation, which changes the modulus of the NIL material 102 after imprinting. The additional FIGS. 2-5 illustrate exemplary methods of performing the NIL material modification process 110. The general process shown in FIG. 1 may be simplified from the actual ML process. Additional preparation, post-processing, and intermediary steps may be omitted for sake of clarity. The imprinting process shown in FIG. 1 may be performed by an imprinting system, such as the NIL system 600 illustrated in FIG. 6.

The imprinting process begins with a layer of NIL material 102. This material may be any material capable of being imprinted, and may differ based on the curing method. For example, a thermally cured process may utilize a thermoplastic polymer as the NIL material 102, while an ultraviolet (UV) curing process may use a photo curable liquid resist as the NIL material 102.

A mask 104 (i.e., a mold) is applied to the NIL material 102 using mechanical force. This creates a layer of imprinted NIL material 106. The mask 104 displaces portions of the NIL material 102 to form a pattern that is an inverse of the pattern of the mask 104. Portions of the NIL material 102 may migrate to fill openings within the pattern of the mask 104. This allows for the creation of three dimensional patterns, i.e., patterns which vary in three dimensions. For example, a profile view of a three dimensional slanted pattern is illustrated in FIG. 1.

The mask 104 is subsequently released from the imprinted NIL material 106. At this point, the imprinted NIL material 106 has a modulus below a low modulus threshold value (e.g., <500 Mpa). This threshold value is a point at which the mask 104, when released from the imprinted NIL material 106, results in a breakage of the NIL material 106 below a threshold percentage (e.g., breakage only in 0.1% of cases). If the NIL material 106 had a higher modulus, then it would be stiffer, and the release of the mask 104 from the NIL material 106 would cause breakage of the NIL material 106 in a percentage of cases that would cause manufacturing yields to fall below an acceptable level.

The imprinted and low modulus NIL material 106 is subjected to a NIL material modification process 108, which increases the modulus of the NIL material 106 beyond a high modulus threshold value (e.g., >1 Gpa). In one embodiment, the NIL material 106 is partially reacted, and the NIL material modification process 108 fully reacts the NIL material 106 to create a layer of NIL material 110 having a high modulus beyond the high modulus threshold value. In another embodiment, an overcoat is applied to the NIL material 106 during the NIL material modification process 108 using atomic layer deposition to create the high modulus NIL material 110. In another embodiment, atomic layer deposition infusion is used during the NIL material modification process 108 to create the high modulus NIL material 110. In another embodiment, a plasticizer is removed from the NIL material 106 during the NIL material modification process 108 to create the high modulus NIL material 110. These various NIL material modification processes 108 will be described below in further detail with reference to FIGS. 2-5.

Various post processing steps may subsequently be applied to the NIL material 110 imprint layer, such as overcoating, high temperature annealing, etching, plasma application, and so on. As the NIL material 110 is of a high modulus, it is less likely to suffer from feature collapse of the imprinted pattern during these post-processing steps. This results in a more accurate pattern at conclusion of the NIL process, resulting in a more accurate product to be used in various applications. For example, if the NIL material is to be used as a waveguide grating, its optical properties will adhere more closely to design specifications by using the process described here as feature collapse is minimized, while also achieving high yields during the imprinting process due to reduction of breakage of the NIL material during release of the mask.

Partially Reacting NIL Material

Figure 2:
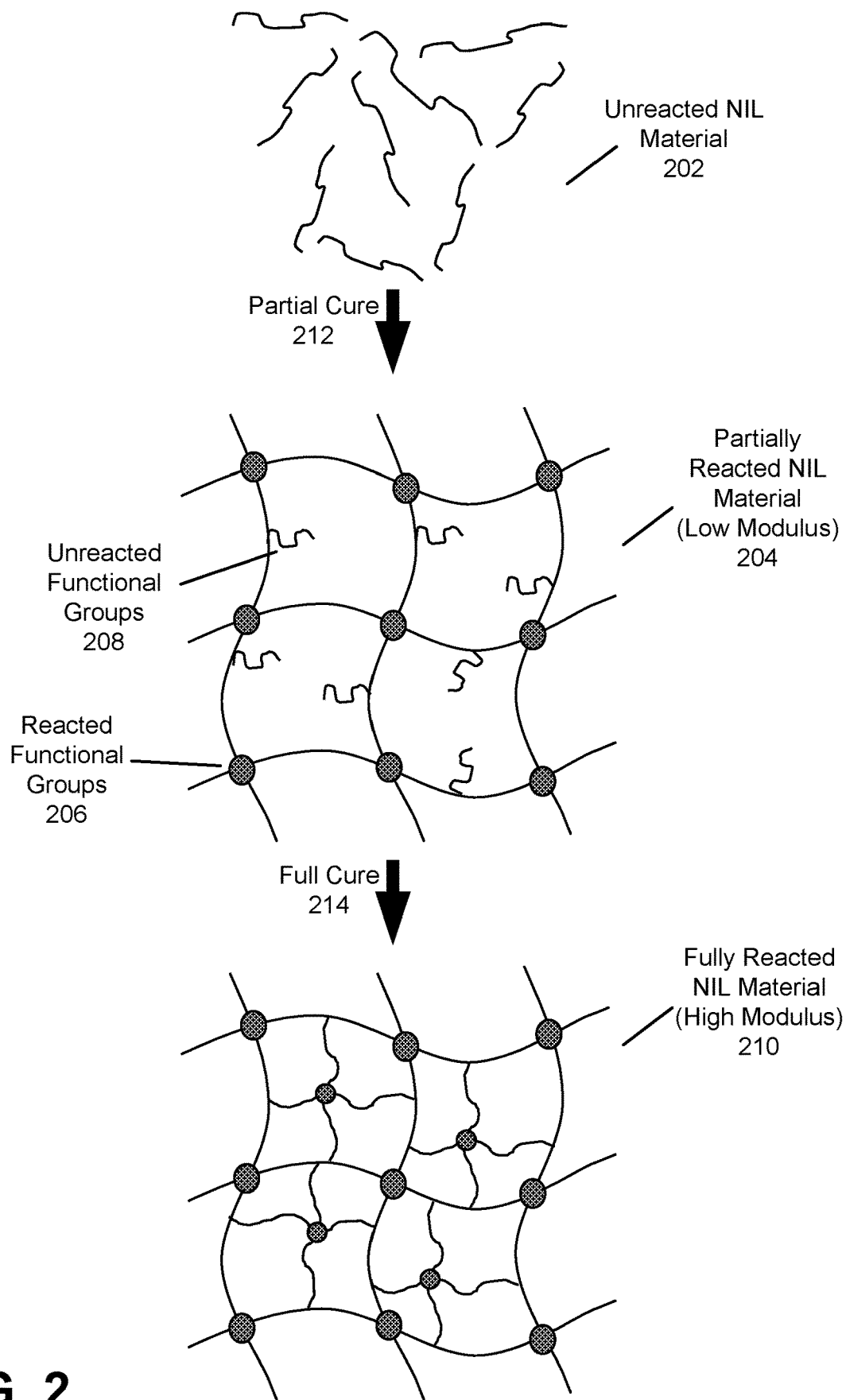
FIG. 2 illustrates an embodiment of the NIL material modification process whereby the NIL material is partially reacted before imprinting and fully reacted after imprinting, according to an embodiment.

FIG. 2 illustrates an NIL material modification process 108 whereby the NIL material is partially reacted before imprinting and fully reacted after imprinting, according to an embodiment. As shown in FIG. 2, the NIL material 202 may begin in a completely unreacted state. Such an unreacted NIL material 202 may not have undergone any curing process, such as application or removal of thermal energy, or curing via UV, etc. This NIL material 202 may have a very low or zero modulus, and may not be in a solid form, e.g., it may be a liquid with high viscosity. The unreacted NIL material 202 may be spin coated or applied in some other fashion to a substrate. Subsequently, the NIL material 202 undergoes a partial cure 212. This partial cure 212 applies the curing process to the NIL material 202, but for a duration or intensity, which only partially cures the NIL material 202, resulting in the partially reacted NIL material 204. This partially reacted NIL material 204 only has some (e.g., 50%), but not all, of the functional groups within the NIL material 204 in a reacted state. Therefore, the partially reacted NIL material 204 includes unreacted functional groups 208, and reacted functional groups 206. The reacted functional groups 206 contribute to the stiffness of the NIL material 204, while the unreacted functional groups 208 do not.

In the case of a UV cured NIL material, a UV light may be applied to the NIL material to cause polymerization of the monomer molecules of the NIL material. The duration and/or intensity of the UV light application may determine how many of the monomer molecules are polymerized. By reducing the duration and/or intensity of the UV light below the threshold needed for full (or near full) polymerization, a partial polymerization of the monomer molecules in the NIL material, e.g., the partially reacted NIL material 204, can be achieved. Examples of such monomer molecules that may be polymerized include acrylates, methacrylates, epoxides, vinyl ethers, and thiols in combination with alkene groups.

This partially reacted NIL material 204 may have a modulus below the low modulus threshold value. The mask, e.g., mask 104, is applied to this partially reacted NIL material 204, and then released, creating an imprint pattern on the partially reacted NIL material 204. Subsequently, the NIL material modification process 108 is applied to the partially reacted NIL material 204 by applying a full cure 214 to the partially reacted NIL material 204 to create the fully reacted NIL material 210. This fully reacted NIL material 210 may have a modulus exceeding the high modulus threshold value, and may be used as an imprint layer in subsequent post-processing steps.

Atomic Layer Deposition Overcoat

Figure 3:
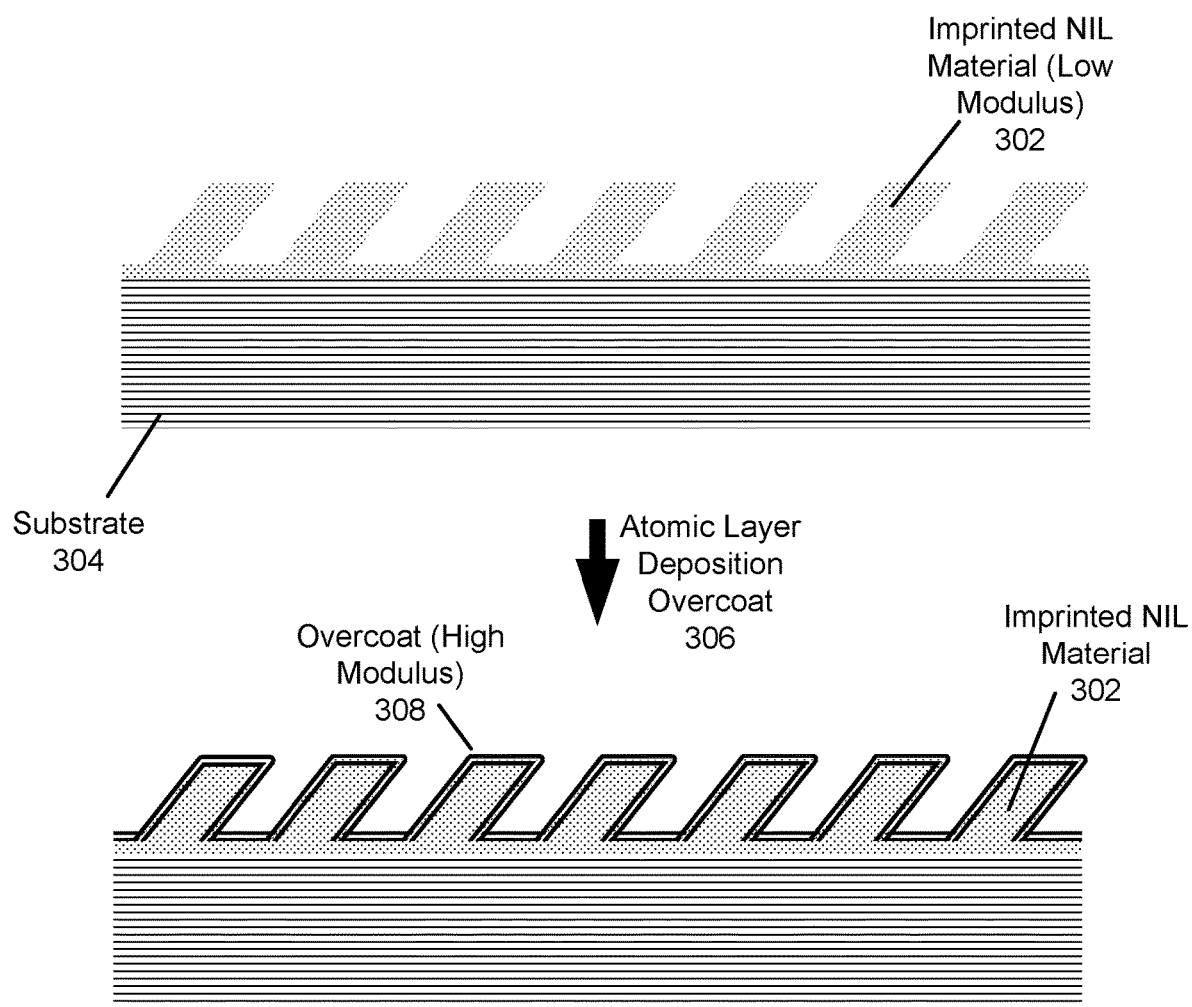
FIG. 3 illustrates an NIL material modification process whereby an overcoat is applied to the NIL material after imprinting, according to an embodiment.

FIG. 3 illustrates an NIL material modification process 108 whereby an overcoat is applied to the NIL material after imprinting, according to an embodiment. As shown in FIG. 3, the modification process is applied to the imprinted NIL material 302, which is still of low modulus. As shown, the imprinted NIL material 302 is placed on a substrate 304. An atomic layer deposition overcoat 306 is applied to the imprinted NIL material 302, in order to generate an overcoat 308 on the imprinted NIL material 302. This overcoat 308 may be of only a few atoms in thickness. The overcoat 308, due to its thickness and/or composition, has a modulus exceeding the high modulus threshold value. This causes the imprinted NIL material 302 to effectively have a high modulus as well, by locking the underlying imprinted NIL material 302 in place physically. The application of the atomic layer deposition overcoat 306 may also be used to increase the dimensions of the imprinted NIL material 302, which may be useful for waveguide design. The application of the atomic layer deposition overcoat 306 may also assist in preventing solvent uptake by the imprinted NIL material 302 during subsequent post-processing steps, thus preserving the structural integrity of the imprinted NIL material 302. Various inorganic materials may be used for the overcoat 308, including $Al_2O_3$, AlN, $Er_2O_3$, $La_2O_3$, MgO, $Sc_2O_3$, $SnO_2$, $HfO_2$, $Nb_2O_5$, $SiO_2$, $Si_3N_4$, $Ta_2O_5$, $Ta_3N_5$, $TiO_2$, TiN, $Y_2O_3$, $Yb_2O_3$, ZnO, ZnS, or $ZrO_2$.

Atomic Layer Deposition Infusion

Figure 4:
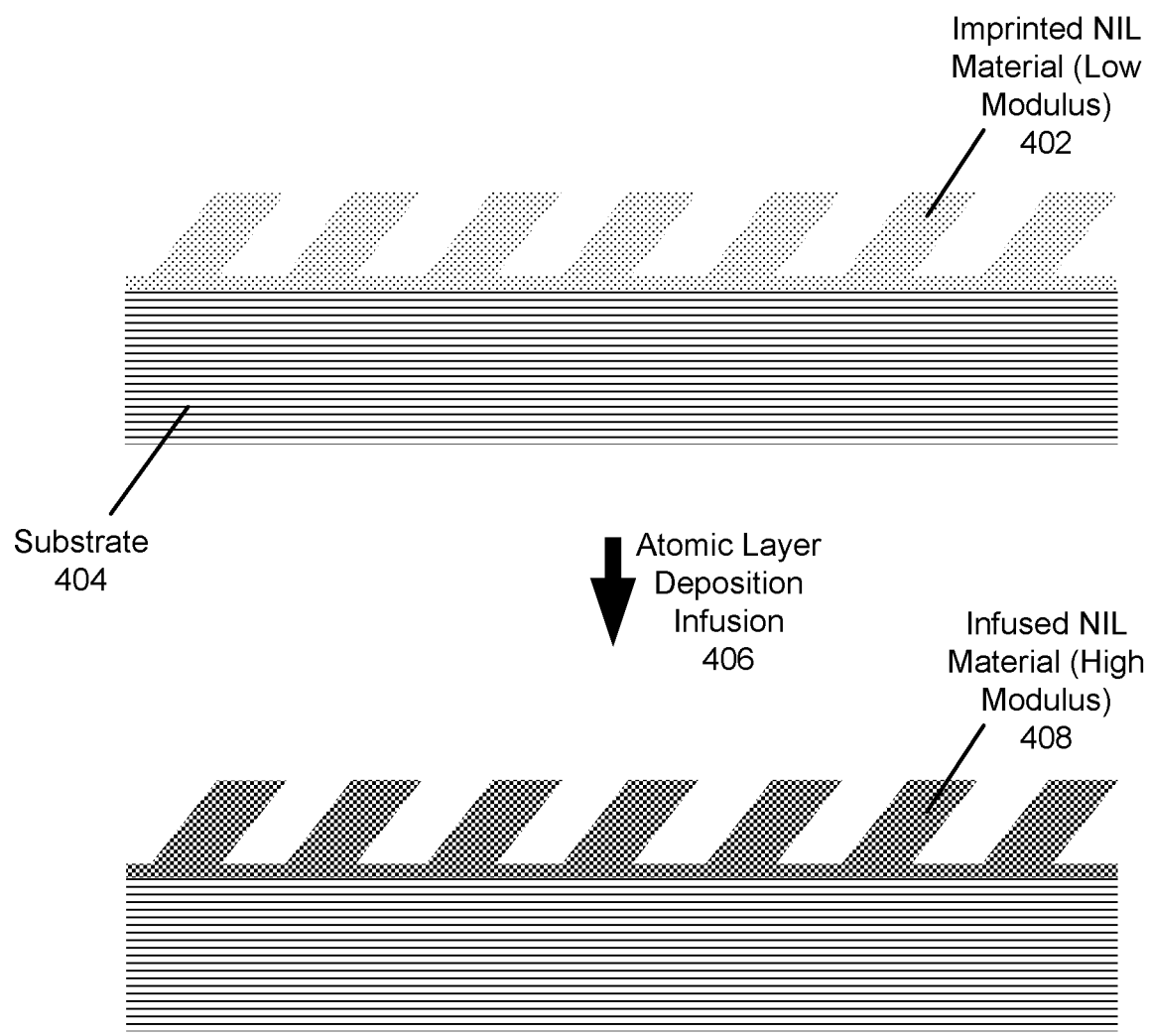
FIG. 4 illustrates an NIL material modification process whereby an inorganic oxide is infused into the NIL material after imprinting, according to an embodiment.

FIG. 4 illustrates an NIL material modification process 108 whereby an inorganic oxide is infused into the NIL material after imprinting, according to an embodiment. As shown in FIG. 4, the modification process is applied to the imprinted NIL material 402, which is still of low modulus (e.g., below the low modulus threshold value).

As shown, the imprinted NIL material 402 is placed on a substrate 404. An atomic layer deposition infusion 406 is applied to the imprinted NIL material 402, in order to generate an infused NIL material 408.

This process infuses inorganic material into the NIL material 402, such that the infused NIL material 408 is uniformly combined with the inorganic material, i.e., the molecules of the inorganic material are uniformly distributed within the infused NIL material 408. This infused NIL material 408 has a modulus that exceeds the high modulus threshold value.

Examples of infusion material may include $Al_2O_3$, AlN, $Er_2O_3$, $La_2O_3$, MgO, $Sc_2O_3$, $SnO_2$, $HfO_2$, $Nb_2O_5$, $SiO_2$, $Si_3N_4$, $Ta_2O_5$, $Ta_3N_5$, $TiO_2$, TiN, $Y_2O_3$, $Yb_2O_3$, ZnO, ZnS, or $ZrO_2$.

Plasticizer Infusion and Removal

Figure 5:
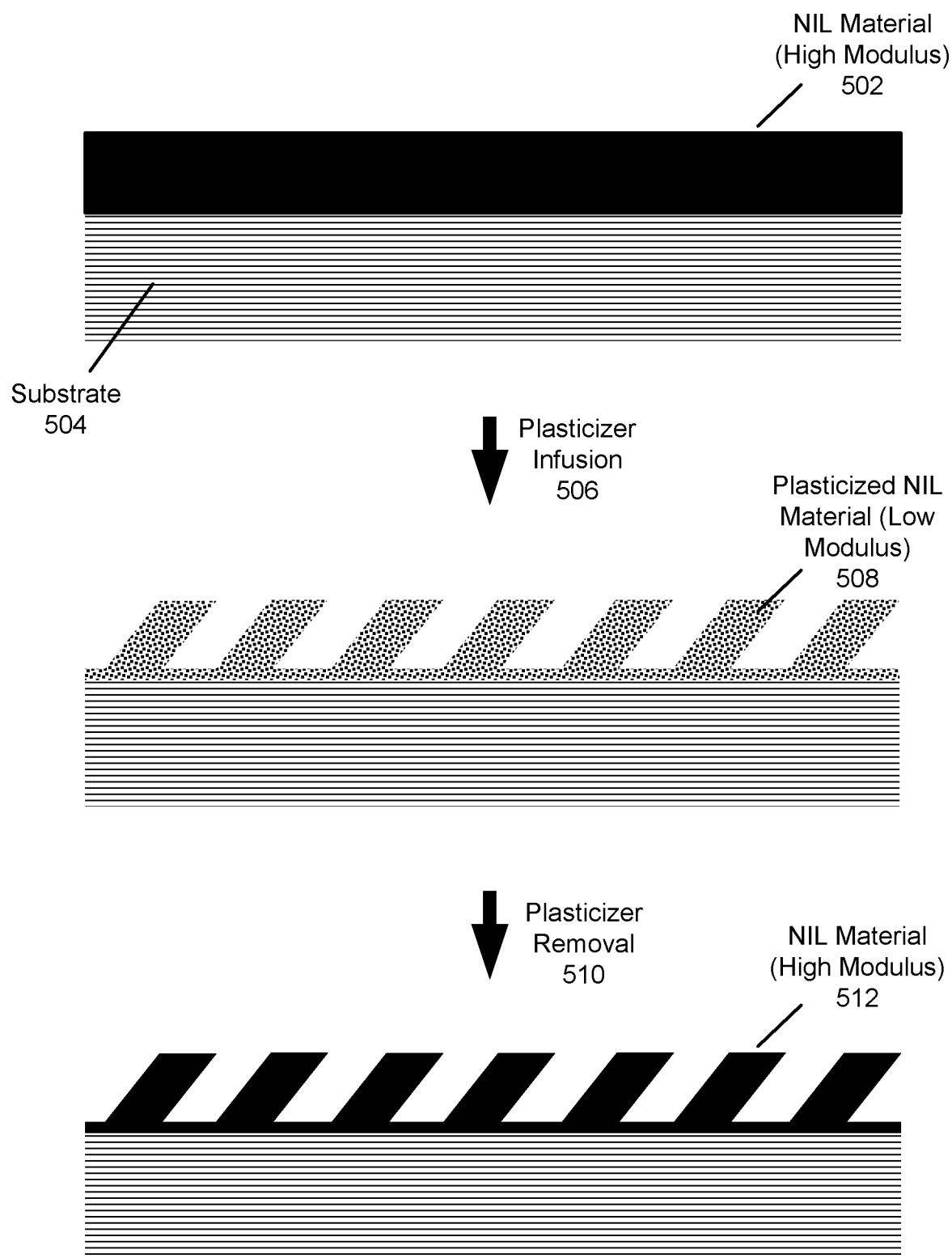
FIG. 5 illustrates an NIL material modification process whereby a plasticizer is removed from the NIL material after imprinting, according to an embodiment.

FIG. 5 illustrates an NIL material modification process 108 whereby a plasticizer is removed from the NIL material after imprinting, according to an embodiment. As shown in FIG. 5, the NIL material 502, which is placed on a substrate 504, originally has a high modulus prior to the imprinting process.

Before the imprinting is performed on the NIL material 502, a plasticizer infusion 506 is applied to the NIL material 502. This creates the plasticized NIL material 508, which has a low modulus (e.g., below the low modulus threshold value), due to the infusion of the plasticizer.

After the imprinting process and the release of the mask, the plasticized ML material 508 undergoes a plasticizer removal 510 process, whereby the plasticizer is removed from the NIL material 508, to create the NIL material 512, which has a high modulus. The addition of the plasticizer (or other non-volatile solvent) does not cause significant evaporation at room temperature and pressure. Examples of plasticizers (or non-volatile solvents) include phthalates (e.g. dibutyl phthalate), dicarboxylic acids (e.g. sebacic acid), branched high b.p. alkanes (isomers of nonane, decane, etc.).

Exemplary System for Nano Imprint Lithography and Nil Material Modification

Figure 6:
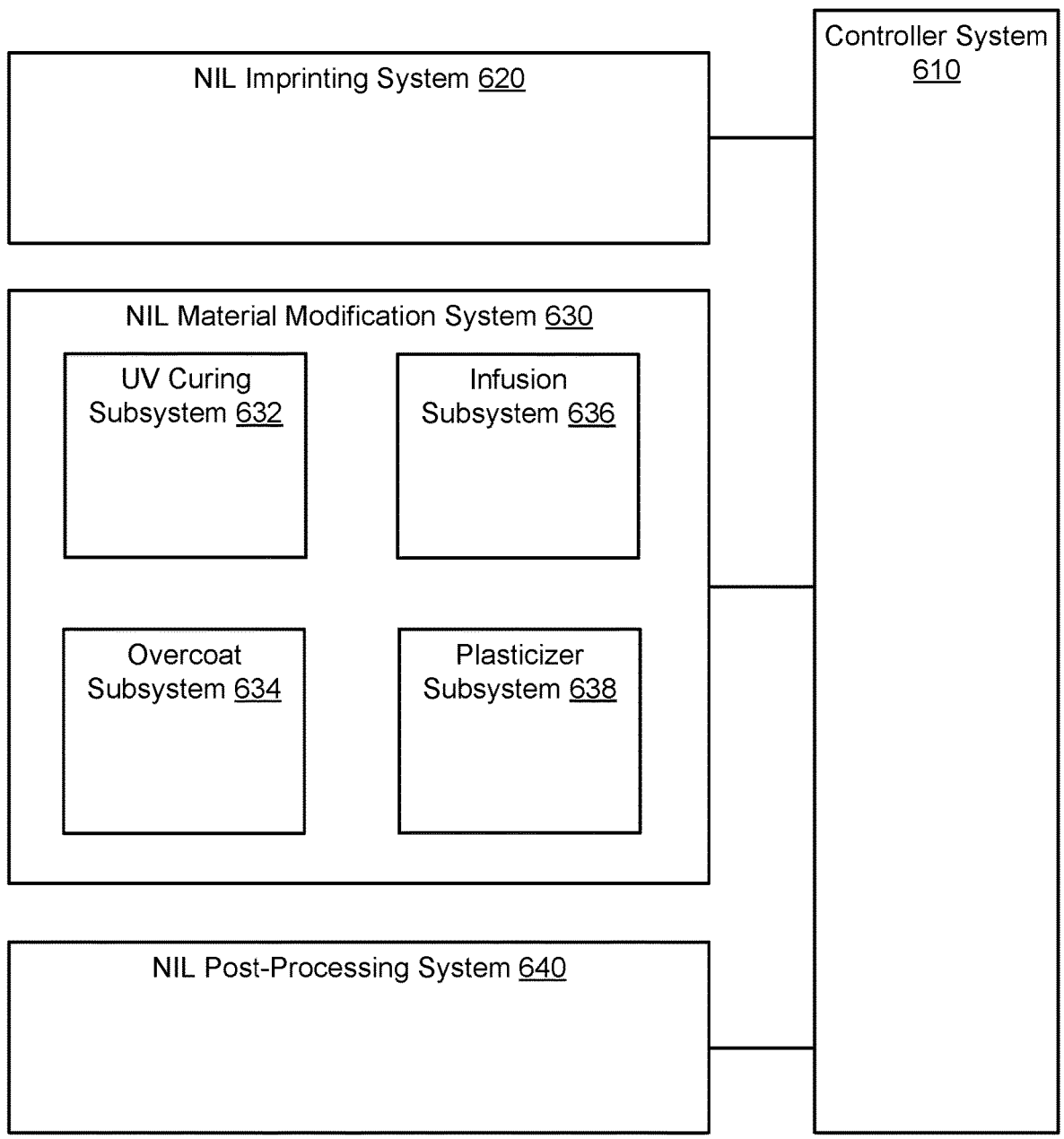
FIG. 6 illustrates an exemplary system for nano imprint lithography and NIL material modification, according to an embodiment.

FIG. 6 illustrates an exemplary NIL system 600 for nano-imprint lithography and NIL material modification, according to an embodiment. The NIL system 600 includes a controller 610, a NIL imprinting system 620, a NIL material modification system 630, and an NIL post-processing system 640. Although certain elements are shown in the NIL system 600, in other embodiments the system 600 includes other elements, and the processes performed by the elements may differ from those shown in NIL system 600 and described here.

The controller 610 generates instructions for the NIL imprinting system 620, the NIL material modification system 630, and the NIL post-processing system 640, in order to create the imprinted NIL material with post-processing from an initially unprocessed NIL material. The instructions generated by the controller 610 may be based on various configuration settings provided by an administrator or other system (e.g., a semiconductor fabrication system). These configuration settings may include a type of pattern to be imprinted, a type of NIL material modification to be used, curing process to be used (e.g., thermal or UV), post-processing options to be applied, the type of NIL material, mask material, substrate material, and other materials to be used in the imprinting process, and so on. Based on these configuration options, the controller 610 transmits instructions to the various systems 620, 630, and 640 to instruct these systems on what materials to use, what processes to execute, when to execute these processes, and so on, in order to create the final imprinted NIL material according to the configuration settings.

For example, the controller 610 may send a set of etching instructions to the NIL imprinting system 620 to create a master mold according to an imprinting pattern and to create a mask using the master mold, with the mask having an inverse pattern of the imprinting pattern. As another example, if the configuration options include UV curing, the controller 610 may transmit instructions to the NIL imprinting system 620 to activate a UV light source against the NIL imprint material at a certain intensity for a certain duration.

The NIL imprinting system 620, based on instructions from the controller 610, imprints the NIL material with a pattern using a mask to create an imprint layer that includes the NIL material imprinted with the pattern from the mask. The NIL imprinting system 620 may receive instructions on the creation of the mask, such as the mask 104. These instructions may indicate the type of material to use for a master mold and a type of material to use for the mask, which is created as an inverse pattern of the pattern of the master mold. The instructions also include the type of pattern to be created. This may be specified using a three dimensional coordinate system, e.g., as a polygonal mesh, or as a set of instructions for using various material removal tools (e.g., etching, ablation) to remove material from a block of the master mold material in a specific sequence, with a specific amount, and so on, to create the pattern of the master mold. The NIL imprinting system 620 may apply the material indicated in the instructions, as well as the instructions for the pattern, in order to create the master mold. The NIL imprinting system 620 subsequently applies the master mold to a material specified by the instructions as the material for the mask.

To apply the mask to a layer of NIL material, such as NIL material 102, the NIL imprinting system 620 may form a layer of the NIL material, using a deposition method such as spin coating, on a substrate. The NIL imprinting system 620 may then apply the mask to the NIL material layer. The application force, duration, speed, and other parameters may be specified by the instructions as well. These instructions may apply to both the application and release of the mask from the NIL material. After imprinting the mask upon the NIL material, the NIL material modification system 630 may be utilized to modify the NIL material, creating a layer of NIL material that has been imprinted with the imprint pattern of the mask. This imprint layer may undergo additional post-processing steps by the NIL post-processing system 640, in order to create a final imprint layer.

The NIL material modification system 630 receives instructions from the controller 610 to apply various modifications to the NIL material under imprint in order to change the mechanical properties of the NIL material. In one embodiment, the NIL material modification system 630 includes a UV curing subsystem 632, an overcoat subsystem 634, an infusion subsystem 636, and a plasticizer subsystem 638.

The UV curing subsystem 632 performs curing on NIL material under imprint, such as the NIL material 202. The curing may be a full curing of the NIL material, or some degree of partial curing. Based on instructions from the controller 610, the UV curing subsystem 632 may initially perform a partial cure on the NIL material. The UV curing subsystem 632 may apply UV light of a particular duration and/or intensity of UV light according to the instructions, on new NIL material which has not undergone any polymerization. The UV curing subsystem 632 may apply the UV light to the NIL material via multiple angles in order to create uniform partial cure, in accordance with instructions from the controller 610. The UV curing subsystem 632 may apply the partial cure using different wavelengths of light, depending upon the wavelength of light to which the NIL material reacts most strongly with. In one embodiment, the UV curing subsystem 632 generates a wavelength of UV light that differs from the wavelength of UV light normally used to cure the NIL material. This alternate wavelength may react with only a few of the functional groups within the NIL material, causing a partial cure. The UV curing subsystem 632 may use one or more mercury vapor lamps, lasers, micromirror devices, or other UV light emitters in order to generate the UV light.

The UV curing subsystem 632 may be able to detect the amount percentage of functional units which have been polymerized in the NIL material by the duration and intensity of exposure, and/or by detecting a change in the NIL material itself, e.g., its opacity to radiation, change in color, resistance to physical forces, change in temperature as heat is applied, and so on. The UV curing subsystem 632 may detect that the partial cure is complete when any one of these detected measurements reaches a set value. Upon detection of completion of the partial cure, the UV curing subsystem 632 may transmit a message to the controller 610 indicating completion of the partial cure, after which the imprint process may occur using the NIL imprinting system 630.

Subsequently, the UV curing subsystem 632 may receive a message from the controller 610 to perform the full cure. The UV curing subsystem 632 receives the imprinted NIL material, and applies the UV light to the NIL material once again. Using a different set of set values, the UV curing subsystem 632 detects when the full cure is completed. At this point the UV curing subsystem 632 may once again notify the controller 610, after which the controller 610 may instruct the NIL post-processing system 640 to perform additional post processing steps on the NIL material, which is now of high modulus.

In one embodiment (not shown), instead of curing the NIL material using UV light, the NIL material modification system 630 includes a thermal curing subsystem to cure the NIL material using the application or removal of thermal energy from the NIL material. In one embodiment, thermal energy may be applied to the non-polymerized NIL material initially, and the thermal energy is carried away (e.g., using a heat exchanger or by convection) subsequently to partially cure or fully cure the NIL material. In another embodiment, thermal energy is applied by the thermal curing subsystem to partially or fully cure the NIL material. The duration, temperature, and/or intensity (i.e., amount) of thermal energy applied may determine what percentage of the NIL material is polymerized.

The overcoat subsystem 634 performs an application of an overcoat on the NIL material under imprint, such as the NIL material 302. Based on instructions from the controller 610, the overcoat subsystem 634 may place the layer of NIL material in a chamber, and expose the surface of the NIL material to one or more reactants, such as the exemplary reactants described for the overcoat 308 above. The reactant may initially be in a different chemical configuration, i.e., a precursor. This precursor is applied by the overcoat subsystem 634 within the chamber that includes the imprinted NIL material. The precursor deposits on the surface of the NIL material. The remaining precursor, which is not deposited on the NIL material, is purged from the chamber. A reactant or catalyst is pumped into the chamber. This reactant or catalyst interacts with the precursor to create a thin film on the surface of the NIL material. Additional thin films with different precursors may be applied in a sequential order to increase the thickness of the thin film. The overcoat subsystem 634 may allow a specified duration of time to pass for each step. The end result is an overcoat applied to the NIL material, such as the overcoat 308. This overcoat 308 is of a very uniform thickness due to the atomic layer deposition method described here. Depending on the precursors used, the overcoat can have a high modulus above the high modulus threshold value. Once the overcoat is applied, the overcoat subsystem 634 may transmit a message to the controller 610 indicating completion of the overcoat process, after which the overcoat subsystem 634 may remove the NIL material from the chamber.

The overcoat subsystem 634 may be able to monitor the quality of the overcoat by analyzing the NIL material with overcoat using electron microscopy, X-ray reflectivity, in situ spectroscopic ellipsometry, and other techniques, to determine overall thickness of the overcoat, uniformity of the overcoat, and so on. If the quality falls below a certain threshold, the overcoat subsystem 634 may indicate to the controller 610 to discard the NIL material under imprint and to report an error.

The infusion subsystem 636 performs infusion of an inorganic material into the NIL material, such as the NIL material 402, in accordance with instructions from the controller 610. The infusion subsystem 636 performs atomic layer deposition in a similar fashion to the overcoat subsystem 634 upon the layer of NIL material. However, the precursor that is applied to the NIL material further reacts with the NIL material and infuses within the NIL material in an additional reactive infusion step. For example, the precursor, once reacted, may bond with hydrogen within the polymer chains of the NIL material. The infusion subsystem 636 may catalyze the reactive infusion step using a catalyst, such as high temperature, high pressure (beyond room temperature and pressure), an oxidizer, etc.

The infusion subsystem 636 may measure the degree of infusion based on duration of the reaction time (under specific conditions), the heat conductivity of the NIL material, the conductivity of the NIL material, and so on. Once the measurement indicates a certain percentage of infusion, the infusion subsystem 636 indicates to the controller 610 that the infusion process is complete.

The plasticizer subsystem 638 applies and removes plasticizer from NIL material, such as NIL material 502, in accordance with instructions from the controller 610. Upon receiving instructions from the controller 610 to infuse the NIL material with plasticizer, the plasticizer subsystem 638 may place the layer of NIL material in a chamber and add plasticizer to the chamber. The plasticizer may react with the NIL material and lower the modulus of the NIL material. The plasticizer subsystem 638 may have to catalyze the infusion of the plasticizer using a change in temperature, pressure, or addition of a catalyst. The plasticizer subsystem 638 may determine that the infusion process is complete after a specified duration of time. The plasticizer subsystem 638 may also measure the level of infusion by measuring the bend strength of the NIL material. If the plasticizer subsystem 638 determines that the duration of infusion is achieved, or that the bend strength is to a specific threshold, then the plasticizer subsystem 638 may determine that the level of infusion is sufficient. The plasticizer subsystem 638 may then purge the plasticizer from the chamber and release the NIL material from the chamber. The plasticizer subsystem 638 transmits a message to the controller 610 notifying the controller that the plasticizer infusion is complete.

Subsequently, the plasticizer subsystem 638 further modifies the NIL material after it has been imprinted. For example, the NIL material after infusion may be the layer of NIL material 508. The plasticizer subsystem 638 may receive instructions from the controller 610 to remove the plasticizer from the NIL material. The plasticizer subsystem 638 may place the layer of NIL material in a chamber, and increase the temperature and reduce the pressure within the chamber beyond a threshold level. The temperature is increased beyond room temperature, and the pressure is decreased below room temperature. This causes the plasticizer to be removed, or baked away, from the NIL material. The plasticizer subsystem 638 may be able to detect the plasticizer which has been removed from the NIL material and within the space of the chamber. The plasticizer subsystem 638 may evacuate the plasticizer from the chamber continuously or periodically. Once the plasticizer subsystem 638 detects a level of plasticizer below a threshold level within the chamber, the plasticizer subsystem 638 may determine that the amount of plasticizer in the NIL material is minimal, and will reduce the temperature and pressure in the chamber. The plasticizer subsystem 638 notifies the controller 610 that the plasticizer removal is completed, after which the NIL material may be transferred to the NIL post-processing system 640.

The NIL post-processing system 640 performs post processing steps on the NIL material after imprinting and after the modification by the NIL material modification system 630, based on instructions from the controller 610. This may include the application of an overcoat, annealing under high temperatures, etching to create additional patterns, orthogonal cross linking of NIL material polymers, oxygen plasma treatment, and so on. For example, the NIL material may be further etched in order to increase the prominence of the imprinted pattern on the NIL material. If the NIL material were of low modulus, this etching process may cause feature shrinkage and other deformities within the imprinted pattern of the NIL material. However, by having a high modulus NIL material, these disadvantages are reduced.

Exemplary Flows

Figure 7:
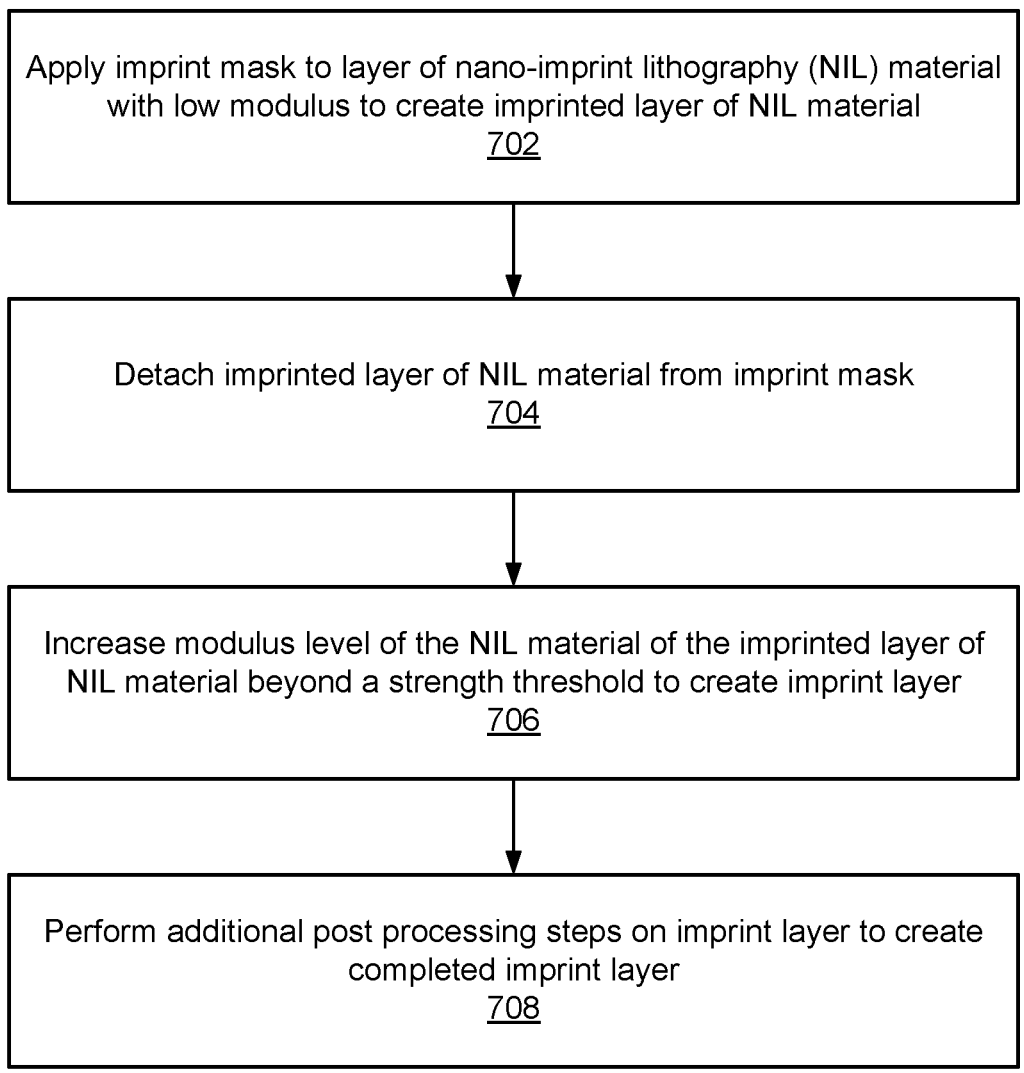
FIG. 7 is a flow chart illustrating a method for NIL in which the NIL imprint material is made to change its mechanical properties using an external influence, according to an example embodiment.

FIG. 7 is a flow chart illustrating a method for NIL in which the NIL imprint material is made to change its mechanical properties using an external influence, according to an example embodiment. Although the flow chart exhibits a certain order, this is not meant to imply that the process described herein must be performed in this order. The operations described here may be performed by the NIL system 600 of FIG. 6.

The NIL system 600 applies 702 an imprint mask, such as mask 104, to a layer of NIL material, such as NIL material 102, to create an imprinted layer of NIL material. The NIL material may be of a modulus level below a flexibility threshold, e.g., the low modulus threshold value described above.

The NIL system 600 detaches 704 the imprinted layer of NIL material from the imprint mask. As the modulus level of the NIL material is below the flexibility threshold, the shape of the imprinted NIL material layer remains unchanged after detachment.

The NIL system 600 increases 706 a modulus level of the NIL material of the imprinted layer of NIL material beyond a strength threshold to create an imprint layer. The imprint layer has a structure that remains unaffected by subsequent post-processing steps. The strength threshold may be the high modulus threshold value described above.

The NIL system 600 performs 708 additional post-processing steps on the imprint layer to create the completed imprint layer.

The foregoing description of the embodiments has been presented for the purpose of illustration; it is not intended to be exhaustive or to limit the embodiments to the precise forms disclosed. Many modifications and variations are possible in light of the above disclosure.

Finally, the language used in the specification has been principally selected for readability and instructional purposes, and it may not have been selected to delineate or circumscribe the inventive subject matter. It is therefore intended that the scope be limited not by this detailed description, but rather by any claims that issue on an application based hereon. Accordingly, the disclosure of the embodiments is intended to be illustrative, but not limiting, of the scope, which is set forth in the following claims.

What is claimed is:

1. A method, comprising:
   infusing a plasticizer into a nano-imprint lithography (NIL) material to form an infused NIL material having Young's modulus below 500 MPa, wherein the plasticizer comprises dibutyl phthalate;
   applying an imprint mask to an infused NIL material layer to create an imprinted NIL material layer, the infused NIL material layer comprised of the infused NIL material;
   detaching the imprinted NIL material layer from the imprint mask; and
   removing the plasticizer from the imprinted NIL material to form an imprint layer having Young's modulus greater than 1 GPa;
   wherein removing the plasticizer from the NIL material further comprises: increasing a temperature and decreasing a pressure of a chamber containing the imprinted NIL material layer, detecting the plasticizer which has been removed from the NIL material and within the space of the chamber, and determining that the amount of plasticizer in the NIL material is minimal when the level of plasticizer falls below a threshold level within the chamber.

* * * * *